(12) United States Patent
Hall et al.

(10) Patent No.: US 7,642,643 B2
(45) Date of Patent: Jan. 5, 2010

(54) APPARATUS FOR MOLDING A SEMICONDUCTOR DIE PACKAGE WITH ENHANCED THERMAL CONDUCTIVITY

(75) Inventors: Frank L. Hall, Boise, ID (US); Todd O. Bolken, Star, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/210,632

(22) Filed: Aug. 24, 2005

(65) Prior Publication Data

US 2005/0280143 A1    Dec. 22, 2005

Related U.S. Application Data

(62) Division of application No. 10/863,979, filed on Jun. 9, 2004, which is a division of application No. 10/154,640, filed on May 24, 2002, now Pat. No. 6,835,592.

(51) Int. Cl.
*H01L 23/34* (2006.01)

(52) U.S. Cl. ..................... 257/712; 438/113

(58) Field of Classification Search ............... 257/100, 257/433, 434, 787–796, 778, 666–677, E23.031–E23.059, 257/706, 783; 438/15, 25, 26, 51, 55, 64–67, 438/112, 124, 126, 127
See application file for complete search history.

(56) References Cited

U.S. PATENT DOCUMENTS

| | | | |
|---|---|---|---|
| 3,646,405 A | 2/1972 | Wallis at al. | |
| 3,782,768 A | 1/1974 | Moore | |
| 4,637,311 A | 1/1987 | Rehmann | |
| 4,803,543 A | 2/1989 | Inayoshi et al. | |
| 5,274,913 A | 1/1994 | Grebe et al. | |
| 5,369,058 A * | 11/1994 | Burns et al. ............ | 438/118 |
| 5,381,599 A | 1/1995 | Hall | |
| 5,450,283 A | 9/1995 | Lin et al. | |
| 5,592,019 A | 1/1997 | Ueda et al. | |
| 5,594,234 A | 1/1997 | Carter, Jr. et al. | |
| 5,604,376 A | 2/1997 | Hamburgen et al. | |
| 5,863,810 A * | 1/1999 | Kaldenberg ............ | 438/27 |
| 5,894,108 A | 4/1999 | Mostafazadeh et al. | |
| 6,002,167 A | 12/1999 | Hatano et al. | |
| 6,013,109 A | 1/2000 | Choi | |
| 6,069,023 A | 5/2000 | Bernier et al. | |
| 6,133,623 A * | 10/2000 | Otsuki et al. ............ | 257/666 |
| 6,191,360 B1 | 2/2001 | Tao et al. | |
| 6,208,519 B1 | 3/2001 | Jiang et al. | |
| 6,329,708 B1 | 12/2001 | Komiyama | |
| 6,333,564 B1 | 12/2001 | Katoh et al. | |
| 6,348,729 B1 | 2/2002 | Li et al. | |
| 6,507,104 B2 | 1/2003 | Ho et al. | |

(Continued)

*Primary Examiner*—Dao H Nguyen
*Assistant Examiner*—Tram H Nguyen
(74) *Attorney, Agent, or Firm*—TraskBritt

(57) ABSTRACT

A method and apparatus for assembling and packaging semiconductor die assemblies utilizes a coating element such as a wafer back side laminate formed on a back side of a semiconductor die is disclosed. The coating element may be formed from a somewhat compressible and, optionally, resilient material, which seals against a surface of a mold cavity while the semiconductor die assembly is being encapsulated. In this manner, the coating element prevents encapsulant material from covering at least a portion of the back side of the semiconductor die to prevent encapsulant flashing over the back side and thus improve heat dissipation characteristics of the packaged semiconductor die during operation.

17 Claims, 5 Drawing Sheets

U.S. PATENT DOCUMENTS

| | | |
|---|---|---|
| 6,558,977 B2 | 5/2003 | Nakaoka et al. |
| 6,858,799 B2 | 2/2005 | Hedler et al. |
| 6,885,522 B1 | 4/2005 | Kira et al. |
| 7,026,710 B2 * | 4/2006 | Coyle et al. ................. 257/704 |
| 2001/0008780 A1 * | 7/2001 | Tandy et al. ................ 438/127 |
| 2002/0180035 A1 | 12/2002 | Huang et al. |

* cited by examiner

APPARATUS FOR MOLDING A SEMICONDUCTOR DIE PACKAGE WITH ENHANCED THERMAL CONDUCTIVITY

CROSS-REFERENCE TO RELATED APPLICATIONS

This application is a divisional of application Ser. No. 10/863,979, filed Jun. 9, 2004, abandoned, which is a divisional of application Ser. No. 10/154,640, filed May 24, 2002, now U.S. Pat. No. 6,835,592, issued Dec. 28, 2004.

BACKGROUND OF THE INVENTION

1. Field of the Invention

The present invention relates generally to packaging of semiconductor dice and, more specifically, packaging of semiconductor dice to provide improved heat dissipation characteristics.

2. State of the Art

During operation, semiconductor devices typically generate large amounts of heat. The amount of heat that a semiconductor device generates is typically related, if not proportional to, the density of features of the semiconductor device. Heat reduces the reliability with which semiconductor devices, including processors and memory devices, operate. In addition, the exposure of semiconductor devices to elevated temperatures for prolonged periods of time may also decrease the useful lives thereof. Accordingly, the dissipation of heat from semiconductor devices has long been a concern in the semiconductor device industry.

The reduced power requirements of state-of-the-art semiconductor dice have been useful for decreasing the amount of heat generated by such semiconductor dice. Nonetheless, as feature densities are ever-increasing, the temperatures generated by semiconductor dice with even reduced power requirements will also continue to increase. Thus, heat dissipation continues to be of concern, even with the low power requirements of state-of-the-art semiconductor dice.

When a semiconductor die is encapsulated, or packaged, the most delicate regions thereof, such as the active surface that bears integrated circuitry and the bond wires that connect bond pads of the semiconductor die to corresponding leads of a lead frame or contacts of a carrier substrate, are covered with a dielectric protective material. In addition, other, more robust surfaces of the semiconductor die, such as the peripheral edges and back side thereof, are also covered with the dielectric protective material. Unfortunately, many of the dielectric protective materials that are used to encapsulate semiconductor dice are not good heat conductors. As a result of the manner in which such dielectric protective materials have been used to coat semiconductor dice, a large amount of the heat generated by an encapsulated semiconductor die becomes trapped within or around the die.

Several approaches have been taken to improve the rate at which heat is transferred and dissipated from packaged semiconductor devices. Conventionally, large surface area structures formed from materials that have good heat conductivity properties and, thus, which are able to "pull" or transfer heat away from a structure, such as a semiconductor die, contacted thereby have been used to dissipate heat from the package during operation of the semiconductor die or dice thereof. These large surface area structures are generally known in the art as "heat sinks." Air circulation systems, which often include cooling fans, have also been used, typically in combination with heat sinks or other heat dissipation means. While heat sinks and air circulation systems may be useful for maintaining conventionally configured semiconductor dice at acceptable operational temperatures in some applications, heat sinks are typically fairly massive and the size thereof prevents further increases in the densities at which semiconductor devices are carried upon circuit boards, as is desired to maintain the trend for ever-decreasing electronic device sizes. In addition, heat sinks may also present locational problems between adjacent, superimposed circuit boards and for space-critical applications, such as laptop and notebook computers, cell phones, personal digital assistants and the like.

As an alternative to the use of space-consuming heat sinks, encapsulation processes have been modified to reduce the amount of dielectric protective material that covers the surfaces of semiconductor dice. Additionally, encapsulation techniques have been developed that protect the most delicate portions of a semiconductor die, while leaving other surfaces of the semiconductor die bare, thereby improving heat dissipation therefrom.

One such technique is described in U.S. Pat. No. 5,604,376 to Hamburgen et al. (hereinafter "Hamburgen"), which describes a packaged semiconductor device in which a back side of a semiconductor die is exposed through an encapsulant to facilitate the dissipation and transfer of heat from the back side of the semiconductor die. The packaged semiconductor device of Hamburgen also includes leads to which bond pads of the semiconductor die are electrically connected. The assembly and packaging method described in Hamburgen includes temporarily securing a bare semiconductor die upon a pedestal by application of a vacuum through the pedestal to a back side of the semiconductor die. Leads are then electrically connected to corresponding bond pads of the semiconductor die by way of conventional wire bonding processes. Next, the assembly is positioned over a bottom half of a mold, with the back side of the semiconductor die resting upon a platform. Upon enclosing the semiconductor die and the bond wires within a cavity of the mold and as a molding compound is introduced into the cavity, a negative pressure is applied through an aperture in the platform to the back side of the semiconductor die, causing the back side of the semiconductor die to be pulled against the platform and purportedly preventing the molding compound from flowing onto the back side of the semiconductor die. This process may be somewhat undesirable for several reasons. For example, as the semiconductor die and the mold platform therefor are both rigid structures, any deviations in the planarity or mutual orientation of either the back side of the semiconductor die or the surface of the platform may permit molding compound to flow therebetween. Such planarity deviations, coupled with the force applied to the semiconductor die to temporarily secure the same to the mold platform, may also exert potentially damaging stresses on the semiconductor die during the encapsulation process.

Another example of a packaged semiconductor device that includes a semiconductor die with an exposed back side is described in U.S. Pat. No. 6,348,729 to Li et al. (hereinafter "Li"). The packaged semiconductor device of Li is formed by attaching an adhesive-coated tape or film to a surface of a lead frame and securing a semiconductor die to the adhesive-coated tape or film, within a centrally located opening of the lead frame. Bond pads of the semiconductor die are then electrically connected with corresponding leads of the lead frame by forming or positioning intermediate conductive elements (e.g., bond wires) therebetween. Next, the semiconductor die, intermediate conductive elements, and regions of the leads that are located adjacent to the semiconductor die and above the tape or film are encapsulated. Finally, the tape or film is removed from the packaged semiconductor device structure (e.g., by peeling). Unfortunately, in addition to exposing the back side of the semiconductor die, surfaces of the leads are also somewhat undesirably exposed. Exposure of the bottom surfaces of the leads may increase the likelihood of electrical shorting between leads as the packaged semiconductor device is positioned upon a carrier substrate, such as a circuit board. Moreover, upon securing the packaged semiconductor device of Li to a carrier substrate, the back side of the semiconductor die thereof will be positioned adjacent or very closely to the carrier substrate, which may hinder the dissipation of heat from the back side of the semiconductor die, defeating the intent of exposing the back side.

During the preliminary stages of semiconductor device fabrication processes, the back sides of silicon wafers and other bulk semiconductor substrates are typically adhered to a preformed dielectric protective film, such as a polyimide film. In addition to protecting the back sides of substrates during fabrication processes and as the substrates are being handled and transported from one fabrication process location to another, these dielectric protective films also retain the positions of the various semiconductor devices that have been fabricated on a particular semiconductor substrate following singulation of the semiconductor devices, which are, at this point, commonly referred to as "dice," from one another. The dice may then be tested or otherwise evaluated, and operable, useful dice picked from the dielectric protective film for further testing, assembly, or packaging.

The inventors are not aware of structures that facilitate heat dissipation from a back side of a semiconductor die through a molded encapsulant while reducing compressional stresses on the semiconductor die during encapsulation thereof and without undesirably increasing the size of the packaged semiconductor device or causing electrically conductive structures from being undesirably exposed through the encapsulant.

BRIEF SUMMARY OF THE INVENTION

The present invention includes methods and apparatus for packaging semiconductor device assemblies in such a way as to facilitate the transfer of heat from the back sides of semiconductor dice thereof.

One aspect of the present invention includes a coating element for use on a back side of a semiconductor die. The coating element is configured to seal against a surface of a mold cavity during packaging of a semiconductor device assembly of which the semiconductor die is a part to prevent packaging material from covering or "flashing" over the back side of the semiconductor die. The coating element may also protect the back side of the semiconductor die during encapsulation of at least portions of the semiconductor device assembly. Accordingly, the material of the coating element may be a somewhat compressible or compliant, and resilient, material which is configured to act as a sealant against an inside surface of a mold while packaging the semiconductor device assembly. The materials of the coating element may also be compressible and compliant, but not necessarily resilient, so that it remains in a substantially compressed state after the encapsulation process. The material of the coating element may also be somewhat durable so that the coating element may protect the die during the assembly and encapsulation processes.

The back side of a semiconductor die may receive a coating element prior to severing the semiconductor die from a common substrate upon which a plurality of semiconductor dice or other electronic components has been fabricated (e.g., at the wafer level), subsequent to singulating the semiconductor die from a wafer or other common substrate, or following assembly of the semiconductor die with a carrier therefor. The coating element may comprise a preformed, substantially planar element or a quantity of uncured material that will be cured and, optionally, patterned following application thereof to the back side of the semiconductor die. The coating element may be applied so as to cover substantially the entire back side of the semiconductor die or, in a variation, to cover only a portion of the back side of the semiconductor die at or proximate a lateral periphery thereof. In the case of applying coating elements onto semiconductor devices that have not yet been severed or singulated from a common substrate, the coating element may comprise a single member that substantially covers the back side of the common substrate and which is severed as the semiconductor devices that have been fabricated on the common substrate are singulated from one another, or separate coating elements may be formed on or secured to the back sides of each yet-to-be severed semiconductor device.

A semiconductor device assembly according to the present invention includes one or more semiconductor dice and a carrier. The carrier and at least one semiconductor die are oriented in a substantially parallel manner relative to one another with the back side of the at least one semiconductor die in the assembly facing outward in such a way as to contact a surface of a mold cavity during encapsulation of the assembly. The carrier and each semiconductor die assembled therewith are electrically connected to one another by way of intermediate conductive elements, such as bond wires, thermocompression bonded leads, conductive tape-automated bonding (TAB) elements carried by a dielectric polymeric film, or the like, for electrical interconnection of the carrier to each semiconductor die thereon.

In use of a coating element according to the present invention, a semiconductor device assembly, including a semiconductor die with a coating element on a back side thereof, may be positioned within a cavity of a mold. This may be done by placing a portion of the assembly in either a first cavity segment of a first mold section or a second cavity segment of a second mold section. In other words, the semiconductor device assembly may be positioned with the coating element adjacent a mold cavity surface of either mold section. As the first and second mold sections are assembled with one another, the semiconductor device assembly is enclosed within the cavity formed by the first and second cavity segments, with at least a portion of the carrier sitting between the first and second mold sections. With this arrangement, the coating element on the back side of a semiconductor die of the assembly may be positioned and sealed against the inside surface of a cavity half of one of the mold sections. Molten dielectric encapsulation material may then be introduced into the mold under pressure so that particular sensitive portions of the assembly, such as a lateral periphery and active surface of the semiconductor die and the intermediate conductive elements electrically interconnecting the die to the carrier, are encapsulated. The seal created against the surface of the mold cavity by the coating element on the back side of the semiconductor die prevents dielectric encapsulation material from flowing over or flashing onto and, thus, covering a substantial portion of the back side of the semiconductor die. By preventing the dielectric encapsulation material from covering the back side of the semiconductor die, heat may readily dissipate from the back side thereof. Further, the coating element provides a compressible surface on the back side of the semiconductor die to reduce potential stresses to the semiconductor die, such as stresses applied to the semiconductor die from the mold wall abutting the back side, during the encapsulation process.

The inside surface or wall of a portion of a mold cavity segment may include a surface finish of enhanced smoothness relative to the finish of the remainder of the mold cavity surfaces. Such a finish may be effected by grinding, lapping or polishing and be at least sized, shaped and positioned on a portion of the inside surface of the mold cavity segment to correspond with the dimensions of the back side of the semiconductor die. During encapsulation of the assembly, the enhanced smoothness surface finish provides a surface that readily creates a seal with the coating element on the back side of the semiconductor die so that the encapsulation material cannot extrude between the back side of the die and the inside surface to form flash on the back side during the encapsulation of portions of the assembly.

Following encapsulation, the packaged semiconductor device assembly may be mounted to higher-level packaging such as a circuit board for use in an electronic system, such as a computer system. In the electronic system, the circuit board electrically communicates with a processor, which electrically communicates with one or more input devices and output devices of the electronic system.

Other features and advantages of the present invention will become apparent to those of skill in the art through a consideration of the ensuing description, the accompanying drawings and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings, wherein:

DETAILED DESCRIPTION OF THE INVENTION

Figure 1:
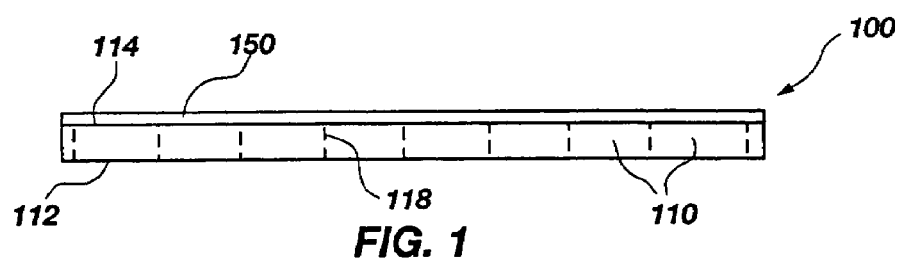
FIG. 1 illustrates a simplified side view of a wafer having a coating element disposed thereon, according to the present invention.

Embodiments of the present invention will be hereinafter described with reference to the accompanying drawings. It would be understood that these illustrations are not to be taken as actual views of any specific apparatus or method of the present invention, but are merely exemplary, idealized representations employed to more clearly and fully depict the present invention than might otherwise be possible. Additionally, elements and features common between the drawing figures retain the same or similar reference numerals.

FIG. 1 illustrates a side view of a wafer 100. Wafer 100 includes multiple semiconductor dice 110 in a physically interconnected array of columns and rows (not shown), each semiconductor die 110 distinguished from others on wafer 100 by broken lines 118, along which the semiconductor dice are separated or singulated, as by sawing or scribing. Wafer 100, and each of the multiple semiconductor dice 110 thereof, includes an active surface 112 and a back side 114. The wafer 100 is formed from a semiconducting material and is preferably formed from silicon, but may be formed from gallium arsenide, indium phosphide or any other known semiconducting material, the electrical conductivity and resistivity of which lie between those of a conductor and an insulator. Other bulk substrates, including partial wafers, as well as silicon-on-insulator (SOI) substrates (e.g., silicon-on-glass (SOG), silicon-on-ceramic (SOC), silicon-on-sapphire (SOS), etc.) are also within the scope of the present invention and included within the meaning of the term "wafer."

According to the present invention, wafer 100 may receive a coating element 150 formed on the back side 114 thereof. Coating element 150 is configured to be compressible or compliant so as to act as a sealant, which will be further described herein. Coating element 150 may be a coating element applied to the semiconductor dice 110 to reduce stresses thereto and/or prevent chipping of the back side 114 thereof during procedures of testing, general handling, singulation and encapsulation procedures. Coating element 150 may be configured to readily conduct and dissipate heat, wherein coating element 150 provides a surface that easily allows heat to dissipate from the semiconductor dice 110. The coating element 150 may have a coefficient of thermal expansion (CTE) similar to that of the adjacent semiconductor or insulator (in the case of nonwafer bulk substrates) material.

Coating element 150 may be applied to the back side 114 of each of the semiconductor dice 110 by flowing a polyimide material thereon (e.g., by known spin-on, screen printing, spray-on, or spreading processes). Such a technique may be especially desirable to employ at the wafer scale. If required, filler material, such as polysilicon, may be added to the polyimide material to adjust the coefficient of thermal expansion to substantially match the coefficient of thermal expansion of the back side 114 of the semiconductor die 110. A photosensitive material such as is employed for etch masking may also be applied, exposed, and developed and undesired portions of the coating element 150 removed from the back sides 114 of semiconductor dice 110, individually but preferably at the wafer scale. In the alternative, the coating element 150 may be already prepared as a preformed polyimide sheet or film, wherein the polyimide sheet or film may be adhesively attached to the back side 114 of the semiconductor die 110 using, for example, a pressure-sensitive adhesive. Such a structure may be termed a "wafer back side laminate." As a further variation, a resin may be applied to a sheet, tape or film to form a composite coating element providing sufficient adherency to the wafer 100 or a semiconductor die 110 along with sufficient resiliency and compressibility. The resin may provide adhesion for the sheet, tape or film to the back sides 114 of semiconductor dice 110.

In whatever form, coating element 150 may be of sufficient thickness such that, in combination with a selected compressibility, it accommodates when compressed at least an average bondline deviation (the deviation between the semiconductor die surface and carrier substrate, such as an interposer, surface during die mount) of between about 20 and 30 µm to prevent flash over the back side 114 during encapsulation. Thus, for example and without limitation, an initial, resiliently compressible coating element thickness of between about 50 and 100 µm may be used to allow for and accommodate bondline deviation while still minimizing the height of the finished package and any thermal barrier to heat transfer from the back side 114 of semiconductor die 110.

The wafer 100 may be singulated along broken lines 118 to provide multiple semiconductor dice 110. The coating element 150 may be disposed on the back side 114 of each of the semiconductor dice 110 prior to, or subsequent to, singulation thereof from the wafer 100. In either case, each of the individual semiconductor dice 110 receives the coating element 150 prior to a die attach process wherein a semiconductor die 110 is secured to a carrier substrate such as an interposer or lead frame.

Figure 2:
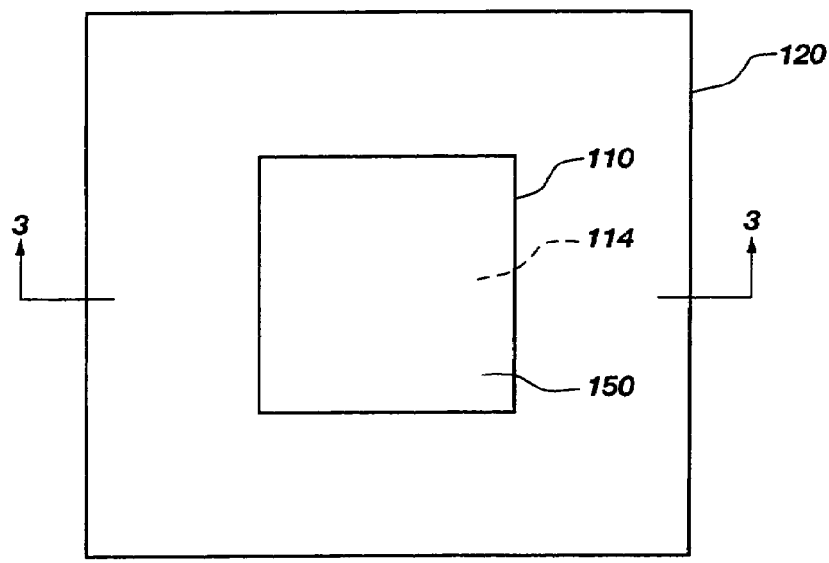
FIG. 2 illustrates a simplified bottom view of a board-on-chip semiconductor assembly, depicting the coating element disposed over substantially an entire back surface of the semiconductor die, according to a first embodiment of the present invention.

FIG. 2 illustrates a bottom view of a board-on-chip (BOC) assembly subsequent to the die attach process. The singulated semiconductor die 110 having the coating element 150 formed on a back side 114 thereof may be attached to a carrier substrate 120. Specifically, as shown, the semiconductor die 110 is attached with its active surface toward the carrier substrate 120 so that the coating element 150 is facing outward.

Figure 3:
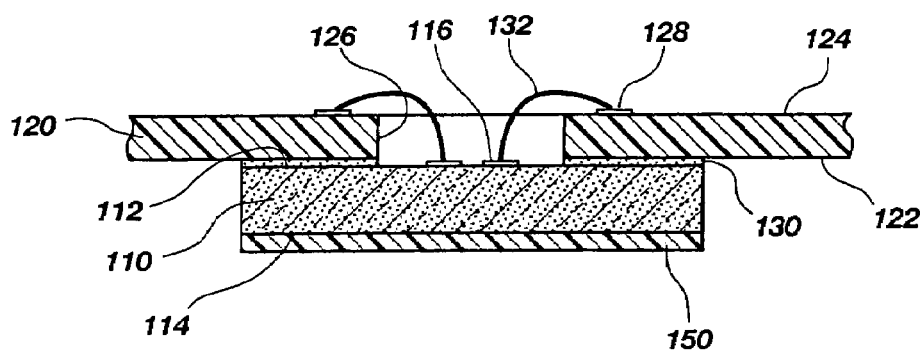
FIG. 3 illustrates a simplified cross-sectional side view taken along line 3-3 in FIG. 2, depicting the board-on-chip semiconductor assembly with bond wires extending between the semiconductor die and the carrier substrate, according to the first embodiment of the present invention.

FIG. 3 is a cross-sectional view taken along line 3-3 in FIG. 2, illustrating the carrier substrate 120 and semiconductor die 110 and the interconnections therebetween. The carrier substrate 120 includes a first surface 122 and a second surface 124 with an opening 126 that may be centrally located in the carrier substrate 120 and extends between the first surface 122 and the second surface 124 on the carrier substrate 120. Carrier substrate 120 may be any suitable carrier-type substrate known in the art, such as an interposer or printed circuit board. Carrier substrate 120 may also be made of any type of substrate material known in the art, such as bismaleimide triazine (BT) resin, ceramics, flexible polyimides, FR-4 or FR-5 materials, glass, insulator-coated silicon, or the like.

The semiconductor die 110 includes an active surface 112 and a back side 114 with bond pads 116 formed on the active surface 112 thereof. The bond pads 116 may be centrally located and exposed on the active surface 112 of the semiconductor die 110 and interconnected with integrated circuitry (not shown) on the active surface 112 of the semiconductor die 110. With this arrangement, the carrier substrate 120 may be secured to a peripheral region of the active surface 112 of the semiconductor die 110 so that the bond pads 116 may be exposed through the opening 126 of the carrier substrate 120. The semiconductor die 110 may be attached to the carrier substrate 120 with one or more adhesive elements 130. The adhesive element 130 may be any known adhesive structure, such as an adhesive decal, adhesive-coated tape, a liquid or gel adhesive material, or the like. Bond wires 132 or other intermediate conductive elements (e.g., conductive tape-automated bonding (TAB) conductive elements carried upon a dielectric polymer film, thermocompression-bonded leads, etc.) may then be formed or extended between the bond pads 116 on the active surface 112 of the semiconductor die 110 and their corresponding conductive pads 128 on the second surface 124 of the carrier substrate 120, with bond wires 132 or other intermediate conductive elements extending through the opening 126.

As illustrated in FIGS. 2 and 3, the coating element 150 may substantially cover the entire back side 114 of the semiconductor die 110 and face outward from the assembled semiconductor die 110 and carrier substrate 120.

Figure 2A:
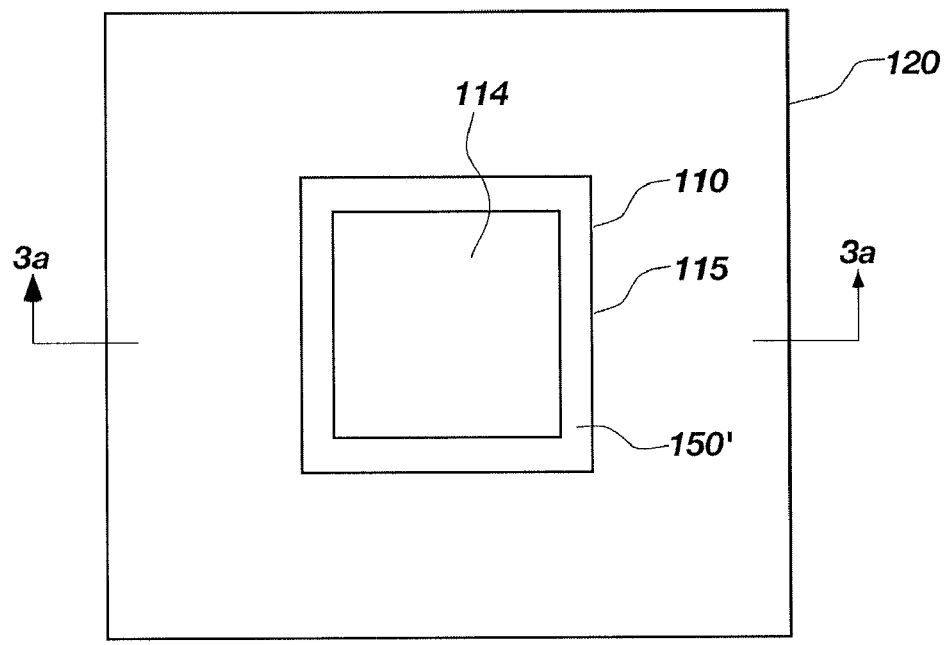
FIG. 2(a) illustrates a simplified bottom view of a board-on-chip semiconductor assembly, depicting the coating element disposed proximate a periphery of the back surface of the semiconductor die, according to a variation of the first embodiment of the present invention.

FIG. 2(a) illustrates a variation of the coating element 150. In this variation, coating element 150' is disposed on the back side 114 and forms a frame proximate only a periphery 115 of the semiconductor die 110. This variation provides that a central portion of the back side 114 of the semiconductor die 110 is left without the coating element 150'. In this alternative, it is contemplated that the coating element 150' may be applied to the back side 114 utilizing a masking and patterning type process, as is well known in the art, using a positive or negative photoresist. Coating element 150' may also be applied by use of a stencil, as is also known. The coating element 150' may be applied to the back side 114 at a wafer level or to each semiconductor die 110 on an individual basis.

Figure 3A:
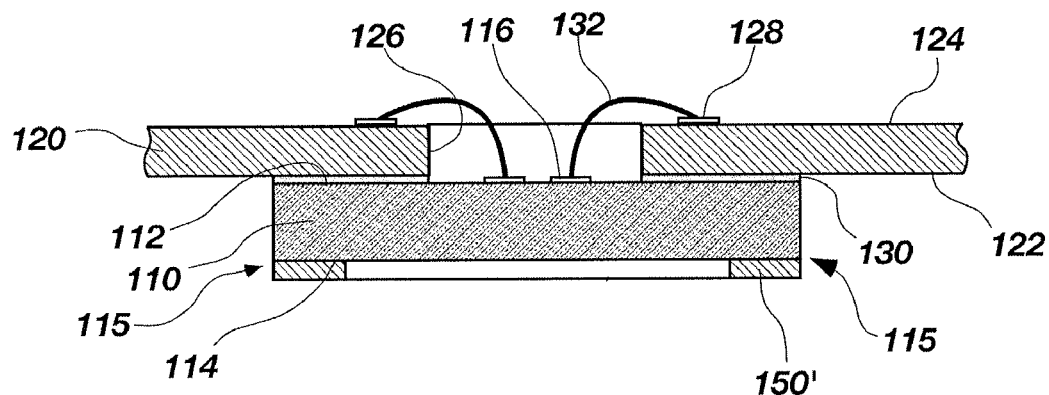
FIG. 3(a) illustrates a simplified cross-sectional side view taken along line 3a-3a in FIG. 2(a), depicting the board-on-chip semiconductor assembly with the coating element disposed proximate the periphery of the back surface of the semiconductor die, according to a variation of the first embodiment of the present invention.

Illustrated in FIG. 3(a) is a cross-sectional bottom view taken along line 3a-3a in FIG. 2(a), depicting the carrier substrate 120 and semiconductor die 110 with the coating element 150' on the back side 114 of the semiconductor die 110 according to a variation of the first embodiment. In particular, the coating element 150' is provided on the back side 114 proximate periphery 115 of the semiconductor die 110 so that a central portion of the back side 114 is left without the coating element 150'.

Figure 4:
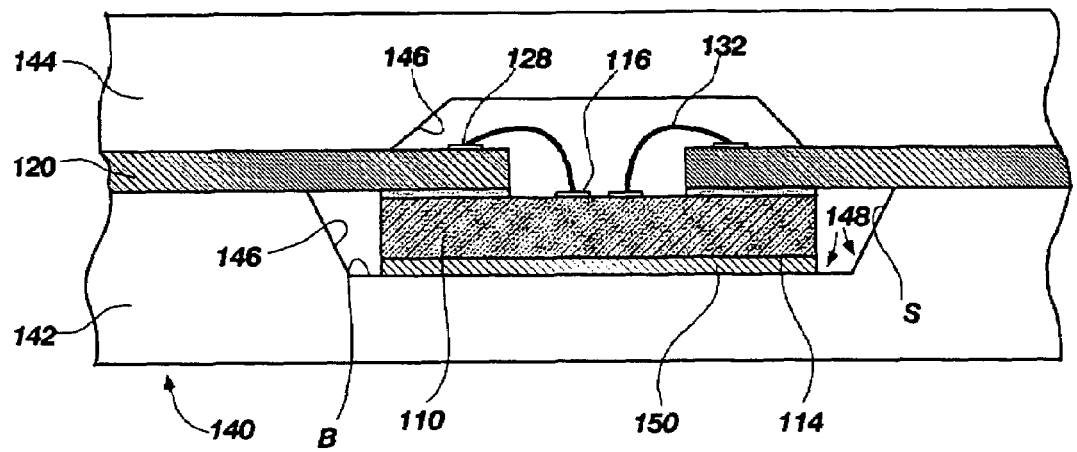
FIG. 4 illustrates a simplified cross-sectional side view of the board-on-chip semiconductor assembly in a mold, depicting a surface of the mold abutting a surface of the coating element, according to the first embodiment of the present invention.

Turning to FIG. 4, the board-on-chip assembly is positioned in a mold 140 preparatory to encapsulating the assembly in a transfer molding process. The term "transfer molding" is descriptive of an example of this process, as a filled polymer thermoplastic molding compound, in a liquid or molten state, is transferred under pressure to a plurality of remotely located mold cavities containing semiconductor device assemblies to be encapsulated. However, for purposes of simplicity, only one mold cavity 146 associated with the mold 140 is depicted in drawing FIG. 4. Pot molding processes, injection molding processes and other encapsulation techniques may also be used with, and benefit from, the present invention.

The mold 140 includes a first mold section 142 and a second mold section 144, each of which includes recesses that together form multiple mold cavities, such as the depicted mold cavity 146. The mold cavity 146 is sized and configured to contain the semiconductor die 110 in the board-on-chip assembly and, specifically, an inside surface 148 of the mold 140 is configured with at least a portion located and oriented to abut with the coating element 150 on the back side 114 of the semiconductor die 110. The mold cavity 146 is also sized and configured to contain, without contacting, the bond wires 132 or other intermediate conductive elements that electrically interconnect the semiconductor die 110 to the carrier substrate 120. In this manner, the mold cavity 146 is filled with a dielectric encapsulation material 134 (FIG. 6), such as a molding compound introduced by transfer or injection molding, to coat, cover and protect at least a periphery 115 of the semiconductor die 110, the bond wires 132, bond pads 116 and conductive pads 128.

Each mold cavity 146 in a transfer mold includes a gate and vent (not shown), as known in the art. The gate is used as an inlet for a thermoplastic dielectric encapsulation material 134 to flow into the mold cavity 146. The vent, typically located at an opposite end of the mold cavity 146 from the gate, permits air or other gases in the mold cavity 146 to be displaced by the wave front of the dielectric encapsulation material 134 and escape from the mold cavity 146 upon introduction of the dielectric encapsulation material 134 thereinto. After entry into the mold cavity 146, the dielectric encapsulation material 134 solidifies and forms a part of the board-on-chip semiconductor package 160.

Figure 4A:
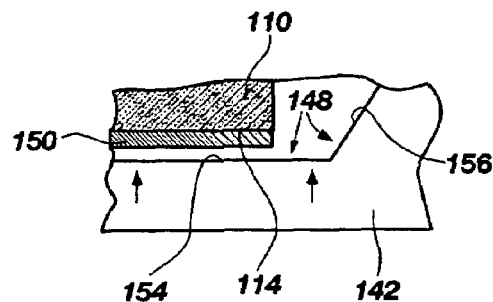
FIG. 4(a) illustrates a simplified partial cross-sectional view of the mold in an unengaged position with the coating element on the semiconductor die, according to the present invention.
Figure 4B:
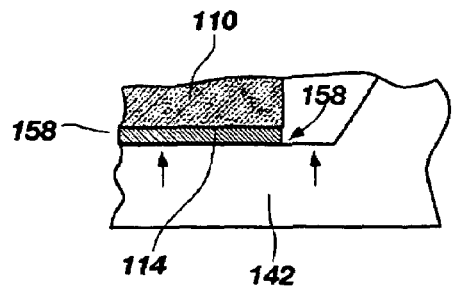
FIG. 4(b) illustrates a simplified partial cross-sectional view of the mold in an engaged position with the coating element on the semiconductor die, according to the present invention.
Figure 5:
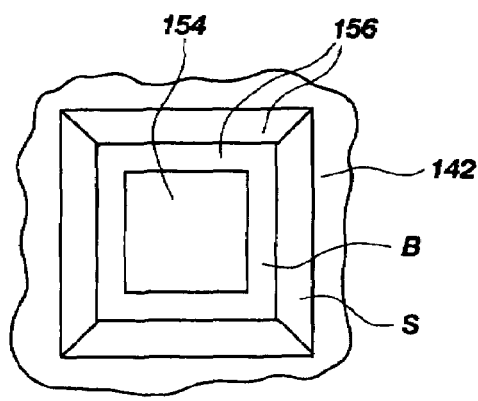
FIG. 5 illustrates a simplified view of the inside surface of the mold, depicting a matte finish and a finely ground finish on the inside surface, according to the present invention.

FIGS. 4(a) and 4(b) illustrate the semiconductor die 110 and an inside surface 148 of the mold 140 in an unengaged position and a fully engaged position, respectively. According to the present invention, the inside surface 148 of the mold 140 may include some regions with a relatively smoother, ground, lapped or polished finish 154 and other regions with a rougher, matte finish 156. The area of the polish finish 154 is substantially sized and shaped to correspond with the back side 114 of the semiconductor die 110 and may be square shaped and centrally located within the matte finish 156 area, as depicted in FIG. 5, illustrating a top inside view of the central, bottom portion B and side portions S of the mold cavity segment of the first mold section 142 (see FIG. 4). The matte finish 156 area may comprise the raw, as cast or machined, inside surface 148 of the mold 140 without further grinding or polishing thereof. With respect to the polish finish 154 area, it exhibits a fine finish, such as a ground, lapped or polished finish, having a surface topography configured to facilitate a seal 158 between the coating element 150 and the inside surface 148 of the mold 140. The seal 158 is provided by coating element 150 when the semiconductor die 110 is in the fully engaged position with the first mold section 142, such as when the first and second mold sections 142 and 144 are assembled with one another. In this manner, seal 158 provided by the coating element 150, resiliently compressed between the semiconductor die 110 and the first mold section 142 in the fully engaged position, is configured to prevent the encapsulation material 134 from flowing over, and flashing onto, the back side 114 of the semiconductor die 110.

It will be appreciated that, once the semiconductor die 110 has been removed from the mold cavity 146, coating element 150 may remain in a substantially compressed state and thus have an outer surface substantially coplanar with that of the hardened dielectric encapsulation material 134 surrounding the coating element 150. Alternatively, the coating element 150 may have sufficient resiliency so as to spring back to an uncompressed thickness or to regain at least a portion thereof, in which instance the outer surface of the coating element 150 may project slightly above the outer surface of the surrounding, hardened dielectric encapsulation material 134.

Figure 6:
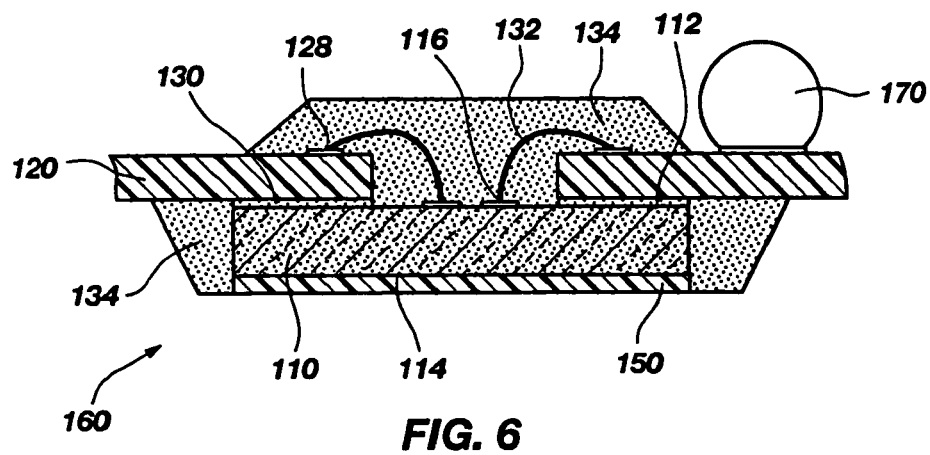
FIG. 6 illustrates a simplified cross-sectional view of a board-on-chip wire bonded semiconductor package, depicting the coating element exposed through the encapsulation material, according to a first embodiment of the present invention.

Turning to FIG. 6, a board-on-chip semiconductor package 160 having portions of the semiconductor die 110 and carrier substrate 120 and the electrical interconnections therebetween encapsulated by dielectric encapsulation material 134 is illustrated. A significant aspect of the present invention is exposure in the finished semiconductor device package of the relatively thin coating element 150 through the encapsulation material 134 on the back side 114 of the semiconductor die 110. With this arrangement, heat may readily transfer through the substrate of semiconductor die 110 from the active surface 112 and dissipate from the back side 114 of the semiconductor die 110. It is notable that coating element 150, due to its relative thinness, is not a significant impediment to heat transfer from the semiconductor die 110 and thus need not be removed from back side 114 and remains as part of semiconductor package 160. If desired, coating element 150 may be colored and may include graphics thereon to identify the manufacturer, part number, etc. Alternatively, coating element 150 may be formulated to be sensitive to heat or to specific wavelengths of electromagnetic radiation to facilitate marking, as by a laser, of the semiconductor package 160 after fabrication, as well as after various stages of testing. As shown at 170, a plurality of discrete conductive elements in the form of solder bumps, conductive or conductor-filled epoxy pillars, or columns or other suitable structures, may be applied to or formed on carrier substrate 120 in communication with conductive traces (not shown) of carrier substrate 120 extending to conductive pads 128 to provide external electrical connections from semiconductor die 110 to higher-level packaging.

Figure 7:
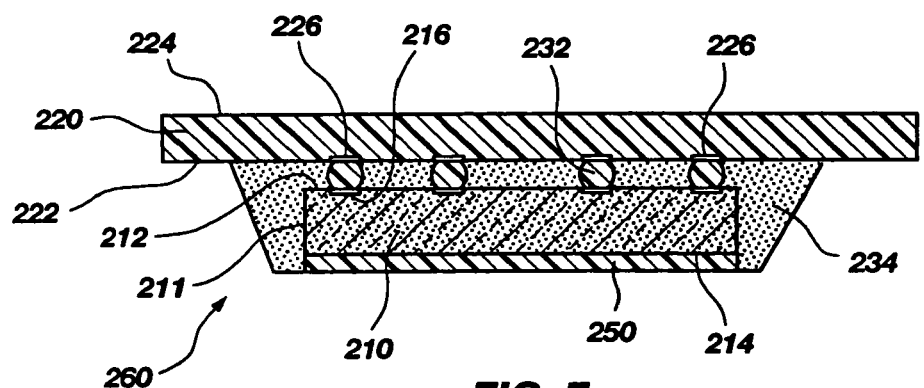
FIG. 7 illustrates a simplified cross-sectional view of a board-on-chip flip-chip semiconductor package, depicting the coating element exposed through the encapsulation material, according to a second embodiment of the present invention.

FIG. 7 illustrates a second embodiment of a semiconductor package 260. The semiconductor package 260 includes a flip-chip type assembly, wherein a semiconductor die 210 is attached facedown to a carrier substrate 220 with discrete conductive elements, such as conductive bumps 232, therebetween. The semiconductor die 210 includes an active surface 212 and a back side 214, wherein the back side 214 includes coating element 250 disposed thereon. The carrier substrate 220 includes a first surface 222 and a second surface 224. The conductive bumps 232 electrically and mechanically interconnect the semiconductor die 210 to the carrier substrate 220 by being disposed between and bonded to bond pads 216 on the active surface 212 of the semiconductor die 210 and conductive pads 226 on the first surface 222 of the carrier substrate 220. A dielectric encapsulation material 234 is introduced in a gap between the semiconductor die 210 and carrier substrate 220, as well as around a periphery 211 of the semiconductor die 210. Similar in fashion to the first embodiment, the back side 214 of the semiconductor die 210 having coating element 250 thereon is exposed through the encapsulation material 234, thereby providing an outlet for heat to dissipate from the semiconductor die 210. Further, the exposed coating element 250 seals to an inside surface of a mold (not shown) during the encapsulation process, in a manner similar to that described in the first embodiment.

Figure 8:
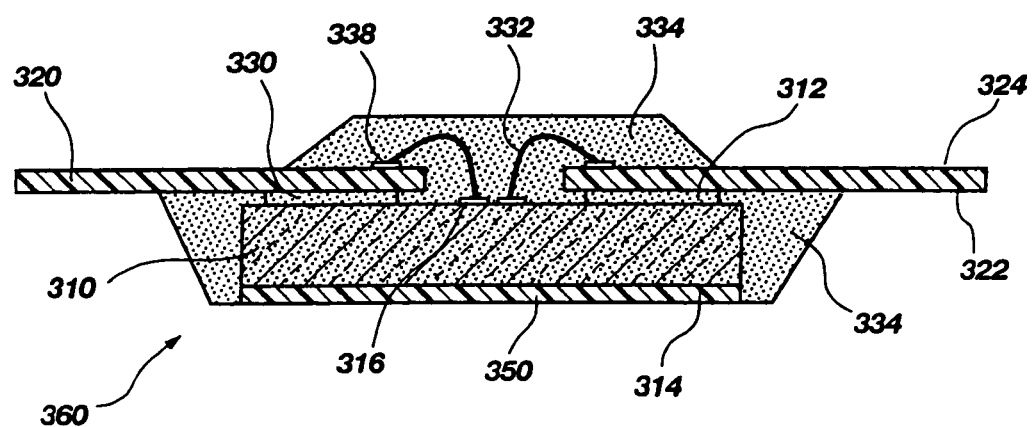
FIG. 8 illustrates a simplified cross-sectional view of a lead-on-chip semiconductor package, depicting the coating element exposed through the encapsulation material, according to a third embodiment of the present invention.

With respect to FIG. 8, a third embodiment of a semiconductor package 360 is illustrated. Semiconductor package 360 includes a leads-over-chip (LOC) type assembly, wherein there is a carrier 320, or leads, attached to an active surface 312 of a semiconductor die 310 via adhesive tape 330 or the like. The carrier 320 includes a first surface 322 and a second surface 324 and is electrically interconnected to the semiconductor die 310 by bond wires 332 or other intermediate conductive elements extending from bond pads 316 on the active surface 312 of the semiconductor die 310 to conductive pads 338 on second surface 324 of the carrier 320. The back side 314 of the semiconductor die 310 includes coating element 350 disposed thereon. With this arrangement, the leads-over-chip assembly may be encapsulated in a mold (not shown) with encapsulation material 334 to encapsulate portions of the semiconductor die 310, the carrier 320 and the bond wires 332 and interconnections thereof. As in the previous embodiments, the coating element 350 is exposed through the encapsulation material 334. Such an exposed coating element 350 may provide an outlet for heat to dissipate from the semiconductor die 310. Other types of lead frame-type assemblies may be utilized in the present invention as long as the coating element 350 on the back side 314 of the semiconductor die 310 is exposed through the encapsulation material 334 to provide a heat dissipation outlet for the semiconductor package 360.

Figure 9:
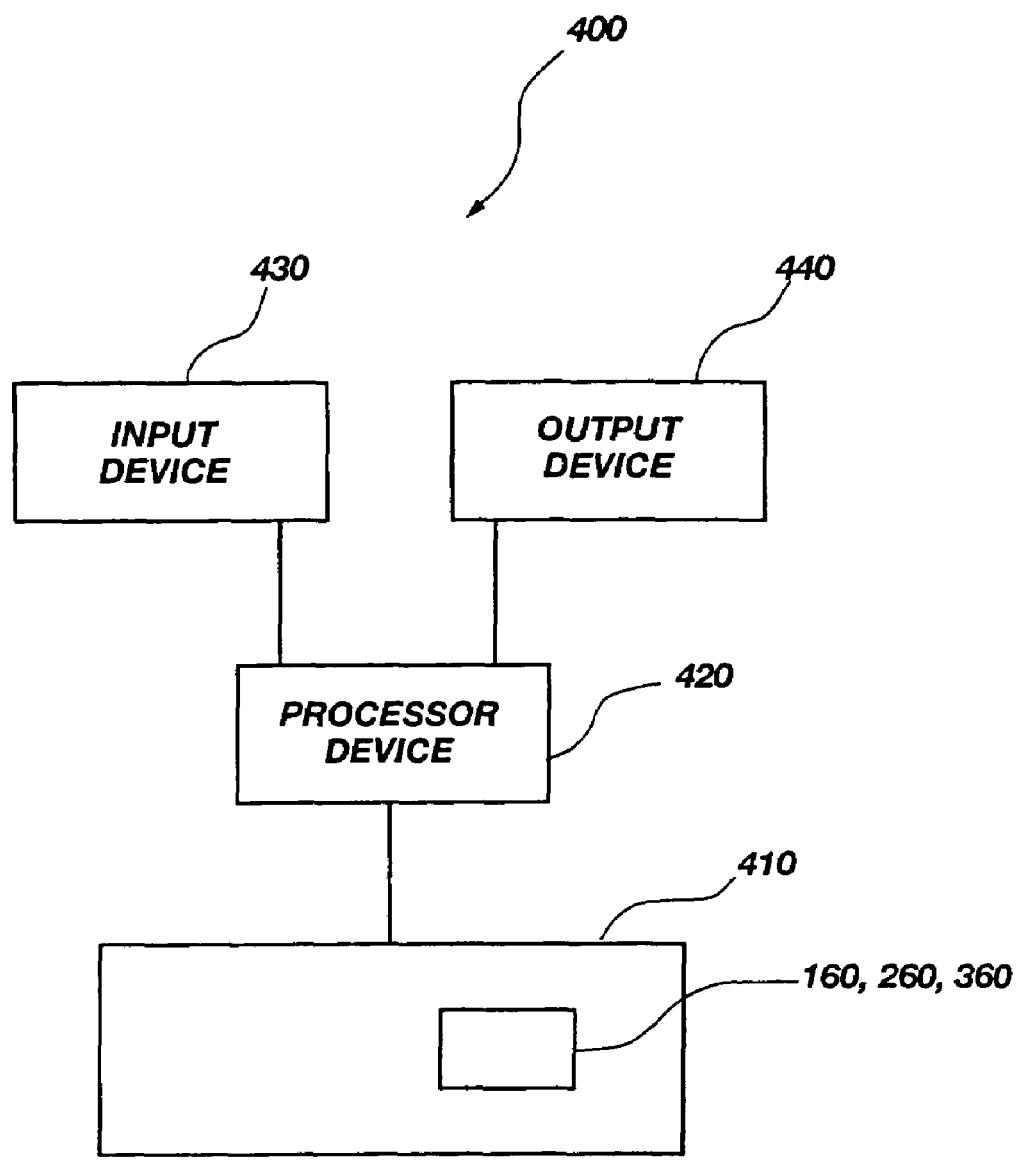
FIG. 9 illustrates a simplified block diagram of the semiconductor assembly of the present invention integrated in an electronic system.

As illustrated in block diagram form in drawing FIG. 9, semiconductor packages 160, 260 and/or 360 may be mounted to a circuit board 410 in an electronic system 400, such as a computer system. In the electronic system 400, the circuit board 410 may be connected to a processor device 420 that communicates with an input device 430 and an output device 440. The input device 430 may comprise a keyboard, mouse, joystick or any other type of electronic input device. The output device 440 may comprise a monitor, printer or storage device, such as a disk drive, or any other type of output device. The processor device 420 may be, but is not limited to, a microprocessor or a circuit card, including hardware for processing instructions for the electronic system 400. Additional structure for the electronic system 400 is readily apparent to those of ordinary skill in the art.

While the present invention has been disclosed with reference to certain illustrated embodiments, those of ordinary skill in the art will recognize and appreciate that it is not so limited. Rather, additions, deletions and modifications to the illustrated embodiments may be made, and features and elements from one embodiment employed, as appropriate, in another. In addition, the coating element of the present invention may be applied between the die and a carrier substrate, such as an interposer, to accommodate bondline deviation and provide the necessary resiliency while leaving the back side of the die bare. Further, the coating element may be placed on the side of the carrier substrate opposite the semiconductor die for bondline deviation accommodation and to provide compressibility. The present invention and the scope thereof is defined by the following claims and equivalents of the elements, features and acts recited therein.

What is claimed is:

1. A mold assembly configured for use in packaging a semiconductor die on a carrier, the mold assembly comprising:
    at least first and second mold sections to be assembled with one another;
    at least one cavity segment formed in each of the first and second mold sections, the at least one cavity segment in each of the first and second mold sections being sized and configured, when in alignment, to define at least one cavity configured to receive a semiconductor die on a carrier; and
    an enhanced portion of an inner surface of the at least one cavity segment of at least one of the first and second mold sections comprising a surface finish of enhanced smoothness relative to at least one other portion of the inner surface;
    wherein the enhanced portion of the inner surface is sized and configured to abut and form a seal with at least a portion of a coating element at substantially the outer periphery of a back side of the semiconductor die received in the at least one cavity.

2. The mold assembly of claim 1, wherein the enhanced portion of the inner surface is substantially centrally located in the at least one cavity segment.

3. The mold assembly of claim 1, wherein the enhanced portion of the inner surface has an outer periphery substantially coincident with an outer periphery of the back side of the semiconductor die.

4. The mold assembly of claim 1, wherein the surface finish of enhanced smoothness of the enhanced portion of the inner surface comprises a ground finish, a lapped finish or a polished finish.

5. The mold assembly of claim 1, wherein the surface finish of enhanced smoothness of the enhanced portion of the inner surface is shaped as a frame.

6. A mold for use in packaging a semiconductor die, the mold comprising:
    at least one mold section having at least one recess in a surface thereof at least partially defining a cavity having a size and shape configured to receive at least a portion of a semiconductor die attached to a carrier substrate in a flip-chip configuration therein; and
    an enhanced portion of a surface of the at least one mold section within the at least one recess comprising a surface finish of enhanced smoothness relative to at least one other portion of the surface of the at least one mold section within the at least one recess;
    wherein the enhanced portion of the surface is sized and configured to abut and form a seal with at least a portion of a coating element at substantially the outer periphery of a back side of the semiconductor die at least partially received in the cavity.

7. The mold of claim 6, wherein the enhanced portion of the surface is substantially centrally located in the cavity.

8. The mold of claim 6, wherein the enhanced portion of the surface has an outer periphery substantially coincident with an outer periphery of the back side of the semiconductor die.

9. The mold of claim 8, wherein the enhanced portion of the surface is shaped as a frame.

10. The mold of claim 6, wherein the surface finish of enhanced smoothness comprises a ground finish, a lapped finish or a polished finish.

11. The mold of claim 6, wherein the at least one mold section comprises a first mold section and a second mold section, the first mold section and the second mold section each comprising a plurality of recesses defining a like plurality of cavities.

12. A mold for use in packaging a semiconductor die, the mold comprising:
    at least one mold section having at least one recess in a surface thereof at least partially defining a cavity having a size and shape configured to receive at least a portion of a semiconductor die therein; and
    an enhanced portion of a surface of the at least one mold section within the at least one recess comprising a surface finish of enhanced smoothness relative to at least one other portion of the surface of the at least one mold section within the at least one recess;
    wherein the enhanced portion of the surface is sized and configured to abut and form a seal with at least a portion of a coating element at substantially the outer periphery of a back side of the semiconductor die at least partially received within the cavity.

13. The mold of claim 12, wherein the enhanced portion of the surface is substantially centrally located in the cavity.

14. The mold of claim 12, wherein the enhanced portion of the surface has an outer periphery substantially coincident with an outer periphery of the back side of the semiconductor die.

15. The mold of claim 14, wherein the enhanced portion of the surface is shaped as a frame.

16. The mold of claim 12, wherein the surface finish of enhanced smoothness comprises a ground finish, a lapped finish or a polished finish.

17. The mold of claim 12, wherein the at least one mold section comprises a first mold section and a second mold section, the first mold section and the second mold section each comprising a plurality of recesses defining a like plurality of cavities.

* * * * *

UNITED STATES PATENT AND TRADEMARK OFFICE
CERTIFICATE OF CORRECTION

| | | |
|---|---|---|
| PATENT NO. | : 7,642,643 B2 | Page 1 of 1 |
| APPLICATION NO. | : 11/210632 | |
| DATED | : January 5, 2010 | |
| INVENTOR(S) | : Frank L. Hall et al. | |

It is certified that error appears in the above-identified patent and that said Letters Patent is hereby corrected as shown below:

On the Title page, in field (62), under "Related U.S. Application Data", in column 1, line 2, after "2004," insert -- now abandoned, --.

Signed and Sealed this

Thirtieth Day of March, 2010

David J. Kappos
*Director of the United States Patent and Trademark Office*

UNITED STATES PATENT AND TRADEMARK OFFICE
CERTIFICATE OF CORRECTION

PATENT NO.       : 7,642,643 B2
APPLICATION NO.  : 11/210632
DATED            : January 5, 2010
INVENTOR(S)      : Hall et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 39 days.

Signed and Sealed this

Sixteenth Day of November, 2010

David J. Kappos
*Director of the United States Patent and Trademark Office*